United States Patent
Herzogenrath

(10) Patent No.: US 10,710,869 B2
(45) Date of Patent: Jul. 14, 2020

(54) MICROMECHANICAL SENSOR

(71) Applicant: Robert Bosch GmbH, Stuttgart (DE)

(72) Inventor: Benny Pekka Herzogenrath, Wuppertal (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 15/981,357

(22) Filed: May 16, 2018

(65) Prior Publication Data

US 2018/0334379 A1 Nov. 22, 2018

(30) Foreign Application Priority Data

May 18, 2017 (DE) .................. 10 2017 208 370

(51) Int. Cl.
*B81B 3/00* (2006.01)

(52) U.S. Cl.
CPC .... *B81B 3/0051* (2013.01); *B81B 2201/0235* (2013.01); *B81B 2203/0118* (2013.01); *B81B 2203/0136* (2013.01); *B81B 2203/04* (2013.01); *B81B 2203/051* (2013.01); *B81B 2207/07* (2013.01)

(58) Field of Classification Search
CPC .......... B81B 3/0051; B81B 2201/0235; B81B 2203/051; B81B 2203/0118; B81B 2203/04; B81B 2203/0136
See application file for complete search history.

(56) References Cited

U.S. PATENT DOCUMENTS

2011/0048131 A1* 3/2011 Reinmuth ............. B81B 3/0051
73/504.12

FOREIGN PATENT DOCUMENTS

| DE | 19526903 A1 | 1/1997 |
| DE | 102007060878 A1 | 6/2009 |
| DE | 102013222747 A1 | 5/2015 |
| DE | 102015218536 A1 | 3/2017 |
| DE | 102016208925 A1 | 11/2017 |
| EP | 0773443 B1 | 5/2000 |

* cited by examiner

*Primary Examiner* — Matthew C Landau
*Assistant Examiner* — Dmitriy Yemelyanov
(74) *Attorney, Agent, or Firm* — Norton Rose Fulbright US LLP; Gerard Messina

(57) ABSTRACT

A micromechanical sensor includes a first functional layer, a second functional layer, and a third functional layer The second functional layer is situated between the first and third functional layers. The second and third functional layers are connected to each other by a connecting area of the third functional layer. The second functional layer is underneath the connecting area at a defined distance from the first functional layer. The first functional layer is underneath the connecting area on an oxide that is situated on a substrate.

8 Claims, 7 Drawing Sheets

MICROMECHANICAL SENSOR

CROSS-REFERENCE TO RELATED APPLICATIONS

The present application claims priority under 35 U.S.C. § 119 to DE 10 2017 208 370.0, filed in the Federal Republic of Germany on May 18, 2017, the content of which is hereby incorporated by reference herein in its entirety.

FIELD OF THE INVENTION

The present invention relates to a micromechanical sensor and to a method for producing a micromechanical sensor.

BACKGROUND

Modern MEMS sensors for measuring inertial quantities, such as acceleration, rate of rotation, etc., are made up of one or more micromechanical structures made of silicon (referred to herein as sensor cores) and an evaluation electronics unit.

For the example of an acceleration sensor, the named sensor cores are essentially made up of a seismic mass suspended centrally on a spring, having electrode fingers and fixed electrodes that are immovably anchored. The seismic mass is at electrical potential CM, and the fixed electrodes are at potential C1 or C2. Between CM and C1, and between CM and C2, a capacitance forms that changes when an external acceleration is applied, because the seismic mass is deflected and the distance of the movable fingers from the fixed electrodes becomes greater or smaller. This change in capacitance can be measured in an evaluation circuit, and the applied acceleration can be calculated from this.

EP 0 773 443 B1 discloses a micromechanical acceleration sensor.

SUMMARY

According to an example embodiment of the present invention, a micromechanical sensor includes: at least three functional layers, including a first functional layer, a second functional layer, and a third functional layer, the second functional layer being situated between the first functional layer and the third functional layer, where the third functional layer and the second functional layer are connected to each other by a connecting area of the third functional layer, the second functional layer is at a defined distance from the first functional layer underneath the connecting area, and, underneath the connecting area, the first functional layer is situated on an oxide that is situated on the substrate.

In this way, the micromechanical sensor solves a stop problem of a sensor having three functional layers. Through the proposed "stalactite-type" stop structure of the sensor, the second and third functional layers can be protected when there are stop problems, so that breakages do not occur when there are large accelerations. In this way, the robustness of the micromechanical sensor is advantageously improved.

According to an example embodiment of the present invention, a method for producing a micromechanical sensor includes: providing oxide on a substrate; providing at least three functional layers that includes a first functional layer, a second functional layer, and a third functional layer, where the second functional layer is situated between the first functional layer and the third functional layer, the second and third functional layers are connected to each other by a connecting area of the third functional layer, and, underneath the connecting area, the second functional layer is at a defined distance from the first functional layer.

An advantageous development of the micromechanical sensor provides that a bumper is formed underneath the connecting area on the second functional layer. Advantageously, in this way an even smaller stop distance can be realized. As a rule, this is done whenever a stop surface is to be realized that is as small as possible. Advantageously, in this way adhesive effects of the sensor core due to adhesion forces can be avoided to the greatest possible extent.

A further advantageous development of the micromechanical sensor is distinguished in that a lateral dimension of the bumper is smaller than a lateral dimension of the connecting area. Advantageously, this supports, to the greatest possible extent, the elimination of shear forces between the second functional layer and the third functional layer.

A further advantageous development of the micromechanical sensor provides that lateral dimensions of the connecting area and the bumper are smaller than a lateral dimension of the second functional layer. In this way, advantageous static properties are provided for the interaction of the three functional layers in the stop structure.

A further advantageous development of the micromechanical sensor provides that the connecting area and/or the second functional layer situated below it are made rectangular, viewed laterally. In this way, conventional lithographic processes are used.

A further advantageous development of the micromechanical sensor is distinguished in that the connecting area and/or the second functional layer situated below it is made rounded when viewed laterally. In this way, further possibilities are provided for the design of the stop structure.

A further advantageous development of the micromechanical sensor provides that a lateral dimension of the connecting area of the third functional layer with the second functional layer is made small, in a defined manner, in relation to an overall lateral dimension of the sensor. In this way, a prevention of the stop is connected with an insubstantial surface outlay of the micromechanical sensor.

A further advantageous development of the micromechanical sensor provides that a vertical distance between the first functional layer and the second functional layer is made smaller, by a defined amount, than a distance between the second functional layer and the third functional layer. Depending on the thickness of the intermediate layers, this can be achieved for example by a bumper.

A further advantageous development of the micromechanical sensor provides that a fourth functional layer, or a fourth functional layer and a fifth functional layer, are situated above the third functional layer. In this way, sensors having more than three functional layers are advantageously provided.

In the following, the present invention is described in detail, with further features and advantages, on the basis of several figures. Identical or functionally identical elements have the same reference characters. The figures are intended in particular to illustrate the essential principles of the present invention, and are not necessarily true to scale. For the sake of clarity, it may be that not all the reference characters are included in all the figures.

Disclosed device features result analogously from corresponding disclosed method features, and vice versa. This means in particular that features, technical advantages, and statements relating to the micromechanical sensor result analogously from corresponding statements, features, and technical advantages relating to the method for producing a micromechanical sensor.

DETAILED DESCRIPTION

Figure 1:
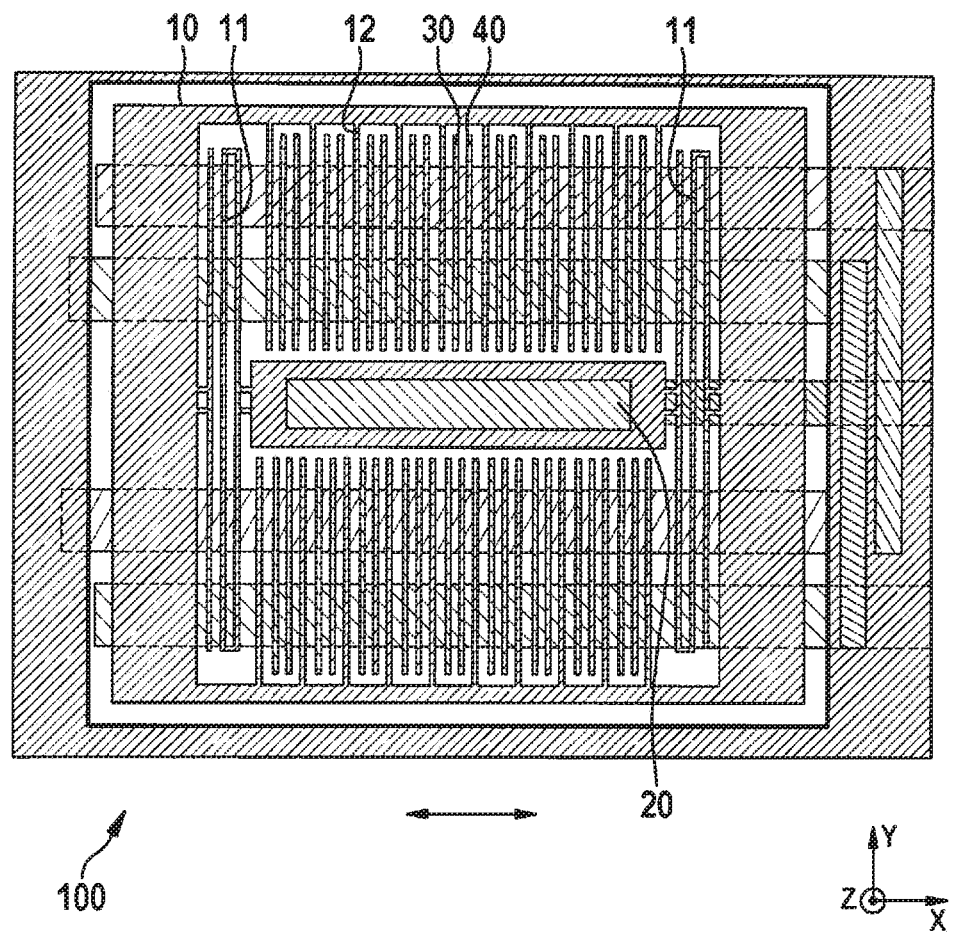
FIG. 1 shows a top view of a conventional lateral micromechanical acceleration sensor.

FIG. 1 shows, in a top view, a conventional lateral micromechanical acceleration sensor 100, whose seismic mass 10 can move in the x direction of the indicated double arrow or of the indicated coordinate system. It can be seen that seismic mass 10 is fixed by spring elements 11, the spring elements 11 being fixed to an immovable anchor point 20. Finger elements 12 of seismic mass 10, which interact with immovable electrodes 30, 40, acquire changes in capacitance due to the movement of seismic mass 10. Here, seismic mass 10 is at CM potential, electrodes 40 are at C1 potential, and electrodes 30 are at C2 potential.

The named conventional micromechanical acceleration sensor is produced using silicon surface micromechanical techniques. Here, an essential component is the known sacrificial layer technique. In this technique, during the layer construction a sacrificial layer, typically made of silicon oxide, is built up between the substrate and the various functional poly silicon layers (in the following: functional layers). Alternatively, the functional layer can also be made of monocrystalline silicon. During the layer deposition, the oxide layer is locally opened at the points at which the functional poly layers are to be connected, so that these layers can be deposited immediately on top of one another.

After all functional poly layers, and the oxide sacrificial layers situated between them, have been completely deposited, the sacrificial layers are largely removed in a gas phase etching step, so that the exposed functional poly layers are movable. A sacrificial oxide post has to remain only at points at which an electrically insulating mechanical connection is to be produced between two functional poly layers. The named process is shown schematically in FIGS. 2-5.

Figure 2:
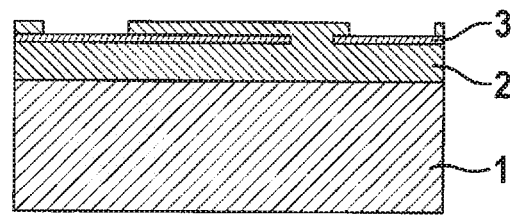
FIGS. 2-5 show results of a conventional production method for producing a micromechanical sensor having three functional layers.

FIG. 2 shows a substrate 1 on which an oxide 2 and a first functional layer 3 have been deposited, and a structuring of first functional layer 3 was carried out. In addition, a deposited and structured oxide layer can also be seen on first functional layer 3.

Figure 3:
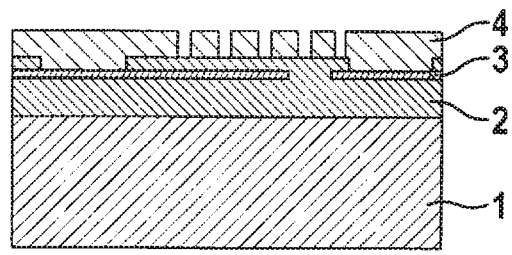

FIG. 3 shows that a second functional layer 4 was deposited on the configuration of FIG. 2, and shows a result of a subsequent structuring of second functional layer 4.

Figure 4:
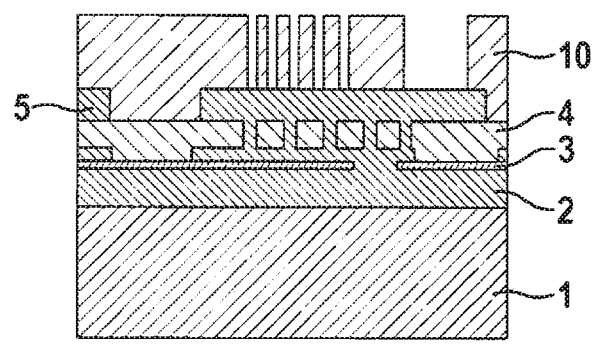

FIG. 4 shows that a second oxide 5 was deposited and structured on second functional layer 4, on which second oxide a third functional layer 10 was subsequently deposited and structured.

Figure 5:
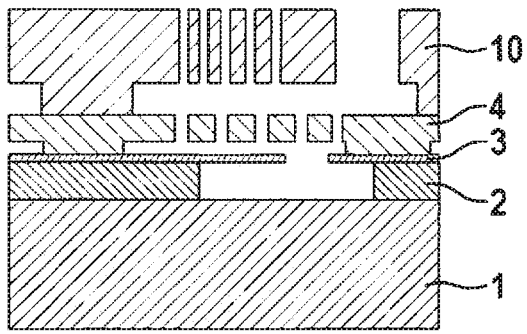

FIG. 5 shows that oxide 5 was removed by a gas phase etching, oxide 5 being removed underneath second functional layer 4, or partially underneath first functional layer 3.

The underetching width in the final gas phase etching is a compromise between the least possible underetching of the structures that are to be connected to the mainland by oxide connections and an underetching that is as large as possible of the movable structures of the third and of the second functional layer 10, 4. Due to this compromise, and the high process scatter in the gas phase etching, it can never completely be prevented that there are regions that are underetched in first functional layer 3 in particular. Because first functional layer 3 is often used only for the electrical wiring of the sensor, this layer is very thin and is correspondingly labile, so that it has to be protected before contact with movable structures (in particular in the case of overload), as is explained below on the basis of FIGS. 6, 7.

Figure 6:
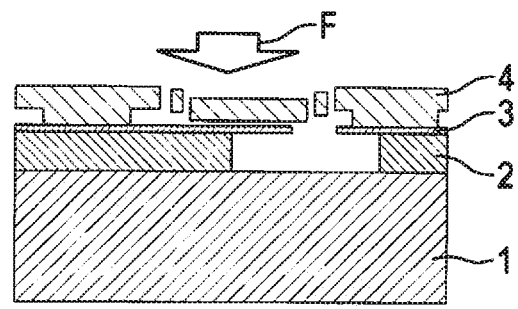
FIGS. 6 and 7 show a problematic conventional micromechanical sensor having two functional layers in the case of an overload.
Figure 7:
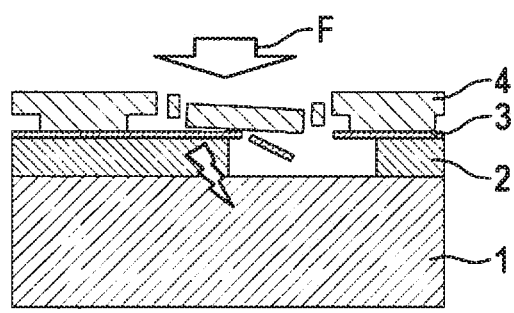

In FIG. 6, it can be seen that when there is the action of a force F (indicated by an arrow), second functional layer 4 is deflected downward onto protruding areas of first functional layer 3. As is shown in FIG. 7, the labile area of first functional layer 3 can break due to this deflection.

In order to prevent this, standardly a recess (indicated by an oval marking) is locally etched into the oxide situated on first functional layer 3 before the deposition of second functional layer 4, as is shown in FIGS. 8-11. In this way, during the subsequent deposition of second functional layer 4, a bumper 4a can be formed that can prevent an impact of second functional layer 4 on the protruding region of first functional layer 3, as is explained on the basis of FIGS. 8-11.

Figure 8:
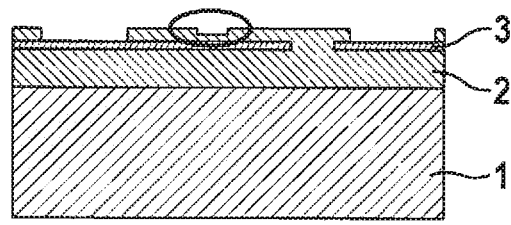
FIGS. 8-11 show results of a conventional production method of a micromechanical sensor having two functional layers, for the solution of the overload problem, according to the existing art.

FIG. 8 shows a marking of the area of the above-named oxide, in which bumper 4a of second functional layer 4 is later formed through deposition of second functional layer 4.

Figure 9:
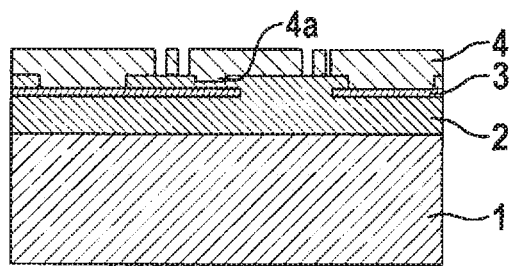

FIG. 9 shows the deposited and structured second functional layer 4, with bumper 4a.

Figure 10:
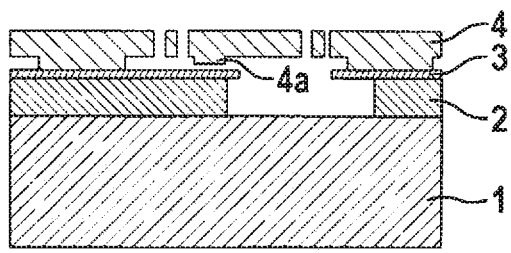

FIG. 10 shows the configuration after the gas phase etching, oxide 2 having been removed underneath second functional layer 4 and partially removed underneath first functional layer 3.

Figure 11:
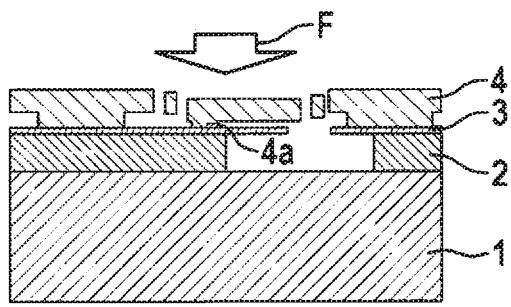

FIG. 11 shows that, due to an externally acting force F, bumper 4a is pressed onto an area of first functional layer 3 underlaid with oxide 2. In this way, first functional layer 3 is advantageously not destroyed. In addition, bumper 4a prevents an overloading and/or breakage of springs, because it limits the possible extent of movement of the movable masses, and thus also of the springs.

In the case of multilayer processes, the use of such a bumper is more difficult, because an uncontrolled pressing of third functional layer 10 onto first functional layer 3 is to be prevented, because the height of bumper 4a that can be achieved with the classical method is significantly smaller than the distance between the named functional layers 10, 3. As a result, uncontrolled impacts on first functional layer 3, high degrees of bending, and spring breakage can occur in the upper functional layers.

Moreover, an additional mask layer has to be introduced that defines the structuring of the oxide plane between second functional layer 4 and third functional layer 10, and corresponding lithography masks have to be produced.

The present invention proposes in particular a micromechanical sensor that realizes at least one defined stop of third functional layer 10 on first functional layer 3 with a distance that is as small as possible between the named layers, without additional masking layers being required. As an example, in the following a lateral acceleration sensor is used as an illustration, as is shown in FIG. 1. The proposed stop structure can however be analogously applied to all types of micromechanical sensors.

For this purpose, it is proposed that the second functional layer 4, situated between first functional layer 3 and third functional layer 10, and oxide layers situated between these, be specifically used. Using these layers, a "stalactite-type" stop structure is formed by which third functional layer 10 can impact in a defined manner on a stable, non-underetched region of first functional layer 3.

For the production of the named stop structure, first a bumper has to be produced in second functional layer 4 over the designated stop area, over first functional layer 3. This can take place through a time-controlled etching process in the upper edge of oxide 2 between these two layers 3, 4, or by stop layer etching, a division of the oxide layer into two individual layers being made, and an etching of the lower layer down to the stop layer being carried out.

Subsequently, this area having the bumper in second functional layer 4 is insulated with a trench. Alternatively, second functional layer 4 can also be removed in a large surface around the bumper.

Finally, in the area of the bumper in second functional layer 4, a connection still has to be created to third functional layer 10, by removing oxide 5 between these two layers 10, 4 before the deposition of third functional layer 10.

Figure 12:
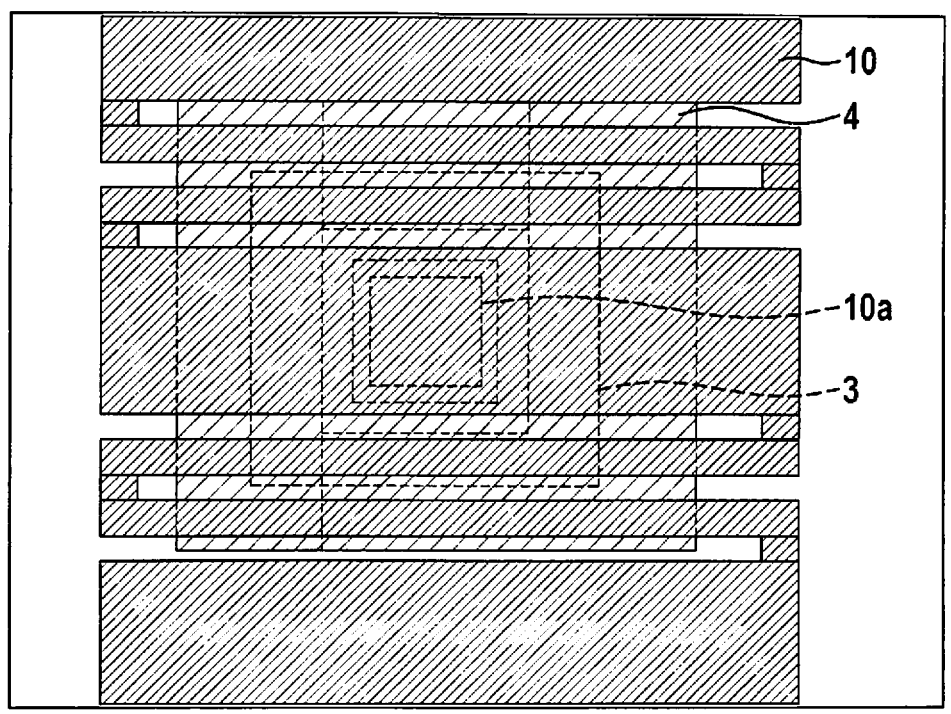
FIG. 12 shows a top view of a micromechanical sensor according to an example embodiment of the present invention.
Figure 12:
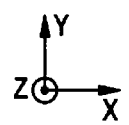
Figure 13:
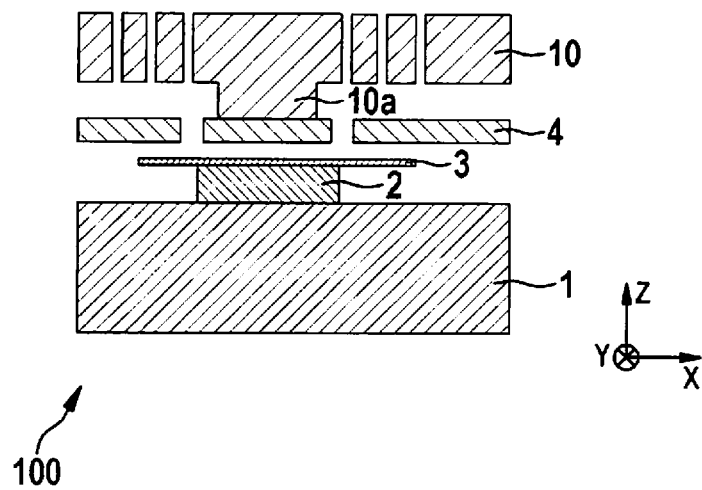
FIG. 13 shows the micromechanical sensor of FIG. 12 in a cross-sectional view, according to an example embodiment of the present invention.

The layout that realizes such a "stalactite-type" stop structure, and a resulting cross-section, are shown in FIG. 12 in a top view and in FIG. 13 in a cross-sectional view. For the realization of the named stop structure, in third functional layer 10, a connecting area 10a is provided that is fixedly connected to second functional layer 4. Here, lateral dimensions of connecting area 10a are smaller than lateral dimensions of second functional layer 4 situated underneath connecting area 10a.

Figure 14:
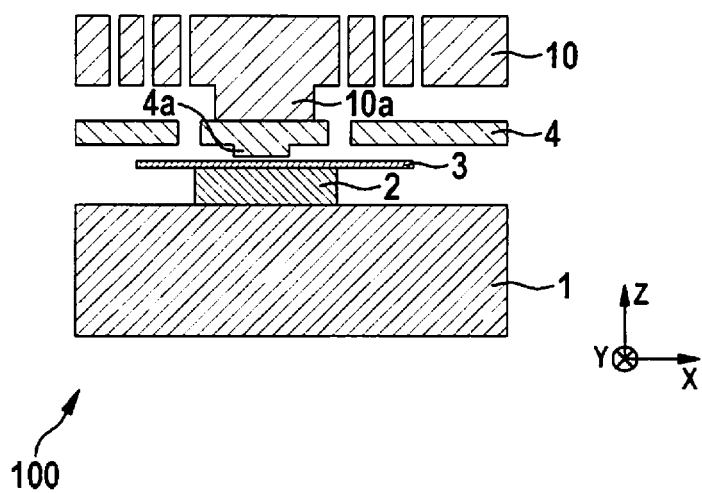
FIG. 14 shows a cross-sectional view of a micromechanical sensor according to another example embodiment of the present invention.

The cross-sectional view of FIG. 14 shows that in addition another bumper 4a is formed on second functional layer 4. In this way, a contact surface is formed having a defined smallness between second functional layer 4 and first functional layer 3, whereby an adhesive effect (e.g., resulting from adhesion) between the two layers 3, 4 can be advantageously reduced.

Lateral dimensions of bumper 4a are in a range of from approximately 3 μm×approximately 3 μm to approximately 10 μm× by approximately 10 μm. In addition, it can be seen that connecting area 10a between third functional layer 10 and second functional layer 4 is larger than a lateral cross-section of bumper 4a. This supports the prevention of damaging shear forces between connecting area 10a and bumper 4a, and the prevention of damage to the overall stop structure.

As a result, with the underlaying of first functional layer 3 with oxide 2 situated on a substrate 1, a stop structure made up of the three functional layers 10, 4, 3 is created. In this way, for micromechanical sensor 100 a "breaking through" of third functional layer 10 to first functional layer 3 is possible without thus damaging first functional layer 3 and second functional layer 4.

Advantageously, connecting area 10a and second functional layer 4 situated under it having bumper 4a can be made rectangular or rounded, viewed laterally. In this way, a wide variety of possible designs are supported for micromechanical sensor 100.

Lateral dimensions of the proposed stop structure are made smaller in a defined manner, with regard to their surface, than the overall lateral surface of the sensor, so that a surface requirement for the stop structure can advantageously be kept small.

Figure 15:
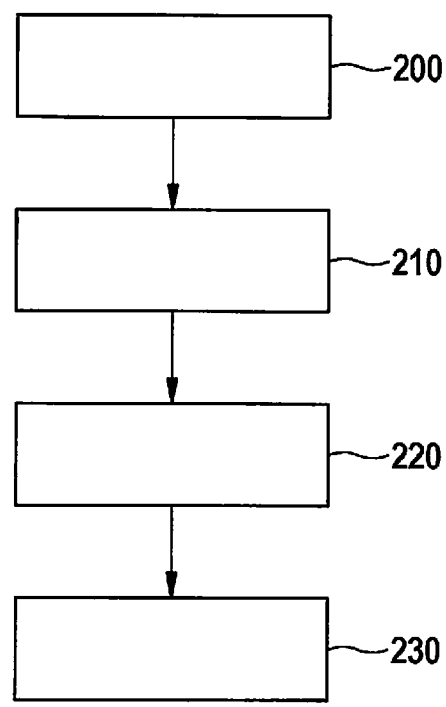
FIG. 15 is a flowchart illustrating a method for producing a micromechanical sensor according to an example embodiment of the present invention.

FIG. 15 is a flowchart that illustrate a method for producing a micromechanical sensor 100 according to an example embodiment.

In a first step 200, a provision of oxide 2 on a substrate 1 is carried out. In a second step 210, a provision is carried out of at least three functional layers 3, 4, 10, having a first functional layer 3, a second functional layer 4, and a third functional layer 10, second functional layer 4 being situated between first functional layer 3 and third functional layer 10. In a third step 220, third functional layer 10 and second functional layer 4 are connected to each other via a connecting area 10a of third functional poly layer 10. In a fourth step 230, second functional layer 4 is fashioned underneath connecting area 10a, at a defined distance from first functional layer 3. Advantageously, here the sequence of steps 210 to 230 is arbitrary, while care is to be taken that micromechanical sensor 100 is built up from bottom to top.

Advantageously, using the design described above, micromechanical sensors 100 can also be realized that have (not shown) a fourth functional layer, or a fourth functional layer and a fifth functional layer, above third functional layer 10.

In sum, the present invention provides a micromechanical sensor and a method for producing a micromechanical sensor that enable increased robustness and thus improved usefulness of the micromechanical sensor. This can be realized in a technically simple manner by a stop structure made up of three functional poly layers and underlaid with oxide.

Advantageously, it is possible to apply the described design to other sensor technologies and topologies as well, for example to piezoresistive micromechanical acceleration sensors or rotational rate sensors. Advantageously, the proposed design can also be applied to micromechanical sensors having more than three functional layers.

Although the present invention has been described on the basis of concrete specific embodiments, it is in no way limited thereto. The person skilled in the art will recognize that many modifications are possible that are not described above, or are only partly described above, without departing from the core of the present invention.

What is claimed is:

1. A micromechanical sensor comprising:
   a substrate;
   an oxide on the substrate;
   a first functional layer;
   a second functional layer; and
   a third functional layer, wherein the second functional layer is situated between the first functional layer and the third functional layer;
   the third functional layer and the second functional layer are connected to each other by a connecting area of the third functional layer;
   the second functional layer is at least partially underneath the connecting area and at a distance from the first functional layer; and the first functional layer is at least partially situated underneath the connecting area and on the oxide, wherein a bottom surface of the connecting area represents a furthest extension of the third functional layer toward the first functional layer, wherein the third functional layer is made of a material, and wherein no portion of the material present in any layer of the sensor extends further toward the first functional layer than the bottom surface of the connecting area.

2. The micromechanical sensor of claim 1, wherein a bumper is fashioned on the second functional layer in a region that is underneath the connecting area.

3. The micromechanical sensor of claim 2, wherein a width of the bumper is smaller than a width of the connecting area.

4. The micromechanical sensor of claim 1, wherein widths of the connecting area and of the bumper are smaller than a width of the second functional layer.

5. The micromechanical sensor of claim 1, wherein at least one of the connecting area and the second functional layer, viewed laterally, is rectangular.

6. The micromechanical sensor of claim 1, wherein a widths of the connecting area and of the second functional layer are smaller than a width of the micromechanical sensor.

7. The micromechanical sensor of claim 1, wherein a vertical distance between the first functional layer and the second functional layer is smaller than a distance between the second functional layer and the third functional layer.

8. A method for producing a micromechanical sensor, the method comprising:
providing an oxide on a substrate;
providing a first functional layer, a second functional layer, and a third functional layer, such that:
the second functional layer is situated between the first functional layer and the third functional layer;
the third functional layer and the second functional layer are connected to each other by a connecting area of the third functional layer;
the second functional layer is at least partially underneath the connecting area and at a distance from the first functional layer, wherein a bottom surface of the connecting area represents a furthest extension of the third functional layer toward the first functional layer, wherein the third functional layer is made of a material, and wherein no portion of the material present in any layer of the sensor extends further toward the first functional layer than the bottom surface of the connecting area.

* * * * *